United States Patent
Huang et al.

(10) Patent No.: US 9,720,013 B2
(45) Date of Patent: Aug. 1, 2017

(54) METHOD OF FABRICATING A SEMICONDUCTOR PACKAGE

(71) Applicant: Siliconware Precision Industries Co., Ltd., Taichung Hsien (TW)

(72) Inventors: Pin-Cheng Huang, Taichung Hsien (TW); Yi-Che Lai, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 320 days.

(21) Appl. No.: 14/044,122

(22) Filed: Oct. 2, 2013

(65) Prior Publication Data

US 2014/0118019 A1     May 1, 2014

(30) Foreign Application Priority Data

Oct. 25, 2012  (TW) .............................. 101139428 A

(51) Int. Cl.
  *G01R 31/26*  (2014.01)
  *G01R 1/04*  (2006.01)
  *G01R 31/28*  (2006.01)

(52) U.S. Cl.
  CPC ........ *G01R 1/0408* (2013.01); *G01R 31/2886* (2013.01); *H01L 2224/16225* (2013.01);
  (Continued)

(58) Field of Classification Search
  CPC . H01L 2224/73265; H01L 2924/15311; H01L 2224/73204; H01L 2924/12042; H01L 2224/97; H01L 2224/32145; H01L 2924/181; H01L 2224/4824; H01L 23/49816; H01L 2224/16145; H01L 23/147; H01L 24/13; H01L 2224/85; H01L 24/96; H01L 2924/15331; H01L 2224/16; H01L 22/14; H01L 2225/06517; H01L 23/50; H01L 24/49; H01L 2924/1532; H01L 2224/16146; H01L 2224/16227; H01L 2224/81; H01L 23/481; H01L 2224/0401; H01L 21/76898; H01L 2225/0651; H01L 2225/06513;
  (Continued)

(56) References Cited

U.S. PATENT DOCUMENTS

| | | | |
|---|---|---|---|
| 5,731,709 A * | 3/1998 | Pastore ................ | G01R 1/0483 324/750.05 |
| 2001/0000650 A1 * | 5/2001 | Akram ................ | G01R 1/0483 324/750.25 |

(Continued)

*Primary Examiner* — Vinh Nguyen
(74) *Attorney, Agent, or Firm* — Mintz Levin Cohn Ferris Glovsky and Popeo, P.C.; Peter F. Corless; Steven M. Jensen

(57) ABSTRACT

A method of testing a semiconductor structure is provided, including providing at least a semiconductor structure having an interposer and a semiconductor element disposed on the interposer; disposing the semiconductor structure on a carrier having a supporting portion, with the interposer being supported by the supporting portion; and performing a test process. The semiconductor structure has been tested for its electrical performance prior to packaging, thereby eliminating the necessity for a conductive pathway to pass through an inner circuit of an package substrate. Therefore, the testing process is accelerated and the time is save.

11 Claims, 3 Drawing Sheets

(52) U.S. Cl.
CPC ............... *H01L 2224/32225* (2013.01); *H01L 2224/73204* (2013.01); *H01L 2924/15311* (2013.01)

(58) Field of Classification Search
CPC ....... H01L 25/0655; H01L 2924/19107; H01L 21/486; H01R 12/57; H01R 13/2414; H01R 43/0263; H01R 12/714; H01R 2201/20; H01R 43/007; H03H 2001/0085; G01R 1/0466; G01R 1/0483; G01R 1/07342; G01R 3/00; G01R 1/0408; G01R 1/0433; G01R 31/318513; G01R 1/0458; G01R 31/2884; G01R 31/2886; G01R 31/318511; G01R 31/2863; G01R 31/2889; G01R 1/44; G01R 31/2853

See application file for complete search history.

(56) References Cited

U.S. PATENT DOCUMENTS

2004/0106229 A1* 6/2004 Jiang .................. H01L 23/3128
438/106
2014/0118019 A1* 5/2014 Huang ................. G01R 1/0408
324/759.01

\* cited by examiner

METHOD OF FABRICATING A SEMICONDUCTOR PACKAGE

CROSS-REFERENCES TO RELATED APPLICATIONS

This application claims under 35 U.S.C. §119(a) the benefit of Taiwanese Application No. 101139428, filed Oct. 25, 2012, the entire contents of which is incorporated herein by reference.

BACKGROUND OF THE INVENTION

1. Field of the Invention

This invention relates to testing methods, and, more particularly, to a method of testing a semiconductor structure.

2. Description of Related Art

With the rapid development of electronic industry, electronic products are required to be compact-sized and low-profiled and having a variety of functionalities. The modern flip-chip technique can reduce the chip packaging area and shorten the signal transmission paths, and is thus applied to various chip packaging fields, such as chip scale package (CSP), direct chip attached (DCA) and multi-chip module (MCM).

In a flip-chip process, since the coefficients of thermal expansion (CTE) of a chip and a package substrate differs from each other significantly, bumps disposed on a periphery of the chip cannot be well bonded to corresponding contacts disposed on the package substrate, and are easily striped off from the package substrate. With the increasing integrity of an integrated circuit, the thermal stress and warpage generated due to the mismatch of the CTEs of the chip and the package substrate are server. As a result, the reliability of the chip between the package substrate is decreased, and the reliability test fails.

Besides, a plurality of chips are disposed on the package substrate in a two-dimensional manner. The package substrate has to have a great area, in order for more chips to be disposed thereon, which contradicts the compact-sized and low-profiled requirements of the modern electronic products.

In order to solve the above problem, a three-dimensional chip-stacking technique using a semiconductor substrate as an intermediate structure is brought to the market. A silicon interposer is disposed between a package substrate and a semiconductor chip additionally. Because the silicon interposer and the semiconductor chip are made of similar materials, the problem of mismatched CTEs is solved. A circuit is fabricated by a semiconductor wafer process on a side of the silicon interposer where the semiconductor chip is disposed, and contacts or a circuit of the semiconductor chip that are to be electrically connected to the circuit of the silicon interposer are also fabricated by the semiconductor wafer process. Therefore, a plurality of semiconductor chips can be disposed on the silicon interposer, even if the area of the silicon interposer is not enlarged. The semiconductor chips can be also stacked on one another, in order to meet the compact-sized and low-profiled requirements of the modern electronic products.

As shown in FIG. 1A, a plurality of conductive through-silicon vias (TSV) 100 are formed on a whole silicon substrate (not shown) or a whole wafer (not shown), upper and lower redistribution layers (RDL) 13a and 13b are formed on upper and lower sides of the silicon substrate, respectively, and a plurality of solder balls 14 are disposed on the lower redistribution layer 13B.

The silicon substrate is singulated to form a plurality of silicon interposers 10. A first semiconductor chip 11a (e.g., a functional chip) is disposed on each of the silicon interposers 10. A plurality of conductive bumps 110 are disposed on the upper redistribution layer 13a. A upper underfill 12a is formed between the first semiconductor chip 11a and the upper redistribution layer 13a to encapsulate the conductive bumps 110.

As shown in FIG. 1B, the silicon interposer 10 is disposed on the solder balls 14 and electrically connected to a package substrate 15. A lower underfill 12b is formed between the package substrate 15 and the lower redistribution layer 13b to encapsulate the solder balls 14.

As shown in FIG. 1C, a second semiconductor chip 11b (e.g., a functional chip) is disposed on the upper distribution layer 13a via a plurality of conductive bumps 110. The upper underfill 12a is also formed between the second semiconductor chip 11b and the redistribution layer 13a to encapsulate the conductive bumps 110. A semiconductor package 1 is thus fabricated.

The fabrication of the semiconductor package 1 is performed in cooperation with a test process. The test process first tests the electrical performance of the fabrication process shown in FIG. 1B, that is the electrical performance of the first semiconductor chip 11a and the silicon interposer 10. A probe is connected to implant balls 150 disposed on the package substrate 15, to perform a first electrical test. After the first electrical test passes, the second semiconductor chip 11b is disposed on the silicon interposer 10, and a second electrical test is performed. Therefore, the overall electrical yield of the semiconductor package 1 is obtained.

However, the test method is performed after the silicon interposer 10 is disposed on the package substrate 15. Therefore, the test process will be performed slowly (because a conductive pathway has to pass an inner circuit of the package substrate 15. As a result, the operation time is long, and the throughout is low.

In the method of fabricating the semiconductor package 1, the formation of the conductive through-silicon vias 100 in the semiconductor chip and the silicon substrate is costly, and some of the interposers 10 may be defective (e.g., having silicon through vias that are defective and are not conductive). Therefore, after the semiconductor chips (e.g., the first and second semiconductor chips 11a and 11b) and the package substrate 15 undergo the electrical test, only the good semiconductor chip or the good package substrate 15 will be disposed on the interposer 10. However, the interposer 10 on which the good semiconductor chip or the good package substrate 15 are disposed may be defective, and the semiconductor chip or the package substrate 15, even though they are good to function, still have to be disposed as junk, together with the defective silicon interposer 10, after the first or second electrical test. For example, although the first semiconductor chip 11a passes the first electrical test, the second semiconductor chip 11b that is electrically connected to a conductive through-silicon via that is not conductive cannot pass the second electrical test, and the whole package has to be disposed as junk. Therefore, the fabrication cost of the overall semiconductor package 1 cannot be reduced.

Therefore, how to solve the problems of the prior art is becoming an urgent issue in the art.

SUMMARY OF THE INVENTION

In view of the problems of the prior art, the present invention provides a method of testing a semiconductor structure, comprising: providing at least a semiconductor structure having an interposer and a semiconductor element disposed on the interposer; disposing the semiconductor structure on a carrier having a supporting portion, with the interposer being supported by the supporting portion; and performing a test process.

In an embodiment, the carrier has an insulation layer formed thereon for combining the supporting portion and the semiconductor element, and the insulation layer is made of a polymer material having high thermal resistance.

In an embodiment, the supporting portion is made of a soft material, such as resin or rubber, and the supporting portion is made of a flexible material such as a sponge.

In an embodiment, the interposer is a silicon-containing substrate and has a plurality of conductive through vias communicating surfaces thereof and a redistribution layer formed thereon and electrically connected to the conductive through vias, and the semiconductor element is combined with and electrically connected to the redistribution layer.

In an embodiment, the method further comprises forming a positioning portion on the carrier, and the positioning portion is a laser notch.

In an embodiment, the method further comprises, subsequent to performing a test process, removing the carrier and the supporting portion and combining another semiconductor element on the semiconductor structure. Then, the method further comprises testing the semiconductor structure to test the another semiconductor element.

The semiconductor structure has been tested for its electrical performance prior to packaging, thereby eliminating the necessity for a conductive pathway to pass through an inner circuit of an package substrate. Therefore, the testing process is accelerated, the time is save, and the throughput is increased.

If a good semiconductor element is disposed on a defective interposer, the defective interposer can be replaced with a good interposer and the semiconductor element can be disposed on the good interposer, because a packaging process is not yet performed. Therefore, the method of the present invention will not dispose the good semiconductor element and the good package substrate, together with the defective interposer, as junk. As a result, the fabrication cost of the overall package is reduced.

BRIEF DESCRIPTION OF DRAWINGS

The invention can be more fully understood by reading the following detailed description of the preferred embodiments, with reference made to the accompanying drawings, wherein.

DETAILED DESCRIPTION OF THE INVENTION

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

FIGS. 2A-2E are cross-sectional views illustrating a method of testing a semiconductor structure 2 according to the present invention.

Figure 2A:
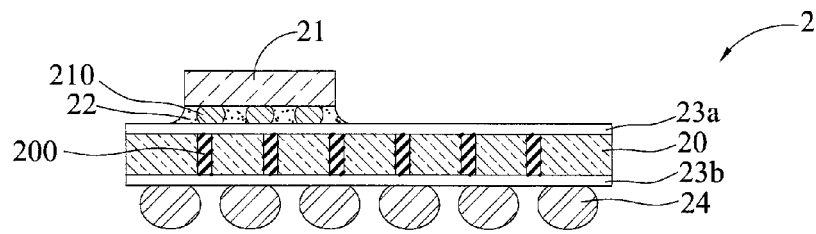
FIGS. 2A-2E are cross-sectional views illustrating a method of testing a semiconductor structure according to the present invention, wherein FIG. 2B' is a top view of a portion of FIG. 2B.

As shown in FIG. 2A, at least a semiconductor structure 2 is provided. The semiconductor structure 2 comprises an interposer 20 and a semiconductor element 21 disposed on the interposer 20. The interposer 20 has a plurality of conductive through vias 200 communicating surfaces thereof. A redistribution layer (RDL) is formed on an upper side of the interposer 20. The semiconductor element 21 is combined with and electrically connected to the redistribution layer 23a via a plurality of conductive bumps 210. An underfill 22 is formed between the semiconductor element 21 and the redistribution layer 23a to encapsulate the conductive bumps 210.

In an embodiment, the interposer 20 is a silicon-containing substrate such as a wafer, the conductive through vias 200 are conductive through-silicon vias (TSV), and the semiconductor element 21 is a functional chip. Another redistribution layer 23b is formed on a lower side of the interposer 20, and a plurality of solder balls 24 are disposed on the another redistribution layer 23b. The redistribution layer 23a and 23b may be formed in a variety of patterns, the description of the fabrication thereof hereby omitted.

Figure 2B:
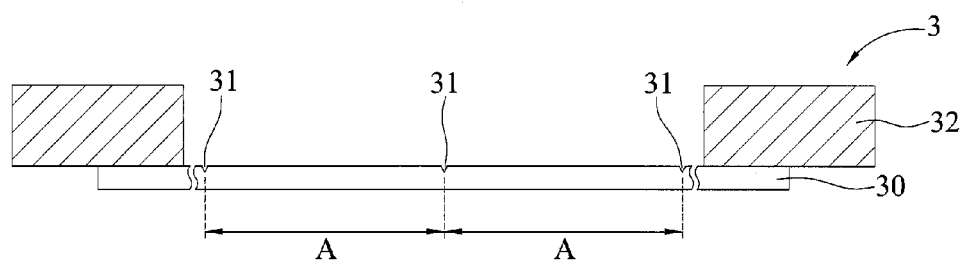
Figure 2B:
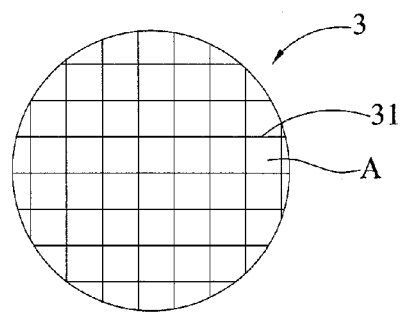

As shown in FIGS. 2B and 2B', a carrier 3 is provided. The carrier 3 has an insulation layer 30 and a periphery frame 32 formed thereon. A plurality of positioning portions 31 are formed on the insulation layer 30 of the carrier 3.

In an embodiment, the insulation layer 30 is a polymer material having high thermal resistance, such as polyethylene and polystyrene, the periphery frame 32 is made of metal, and the positioning portions 31 are laser notches that are rectangular placement regions A formed by laser carving and do not penetrate the insulation layer 30. The semiconductor structure 2 can be placed on the placement regions A. The positioning portions 31 may be formed in a variety of patterns, such as a positioning block, and are not limited to the laser notches.

Figure 2C:
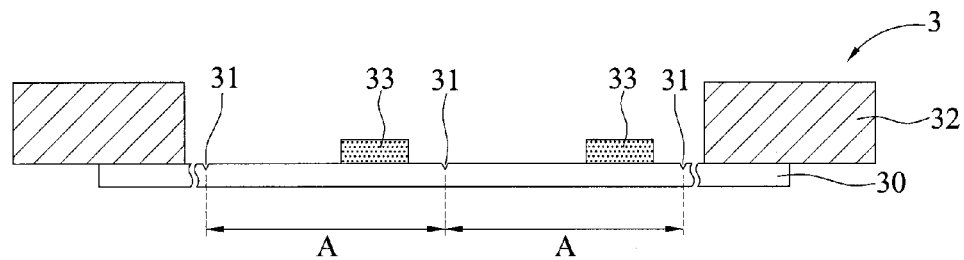

As shown in FIG. 2C, a plurality of supporting portions 33 (e.g., a dummy) are formed on the insulation layer 30 in the placement regions A, and correspond to a region of the interposer 20 where the semiconductor element 21 is not placed.

In an embodiment, the supporting portions 33 are made of a soft material, such as resin or rubber, and are formed by dispensing. In another embodiment, the supporting portions 33 are formed by stacking a plurality of laminated films. In yet another embodiment, the supporting portions 33 are made of a flexible material such as a sponge.

Figure 2D:
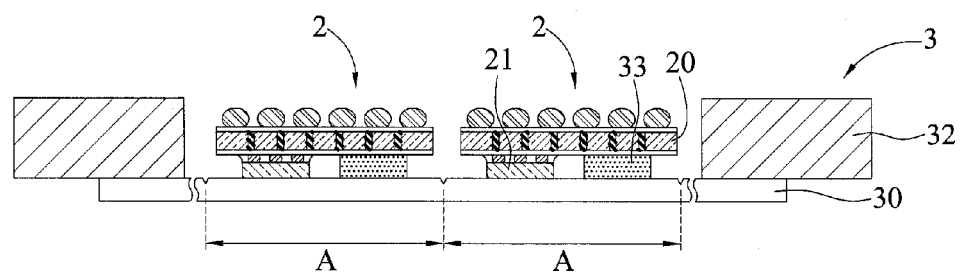

As shown in FIG. 2D, a plurality of semiconductor structures 2 are disposed in a manner that the semiconductor elements 21 are disposed on the insulation layer 30 in the placement regions and the supporting portions 33 support a region of the interposer 20 where the semiconductor elements 21 are not disposed. Therefore, the supporting portions 33 provide a better supporting force to protect the interposer 20 from tilting and collision and prevent a contact force applied by a probe from cracking the interposer 20. Since the supporting portions 33 are made of a soft material, the surfaces of the interposer 20 will not be scraped and damaged due to the friction. Then, the semiconductor structures 2 undergo an electrical test, i.e., the first test process in which probes are electrically connected with the solder balls 24.

In a method of testing a semiconductor structure according to the present invention, the electrical performance of the interposer 20 and the semiconductor elements 21 is tested before a packaging process is performed, to speed up the test process (because the conductive pathway needs not pass an inner circuit of a package substrate). Therefore, the operation time is reduced, and the throughput is increased.

If the semiconductor elements 21 that are good are disposed on the interposer 20 that is defective, the defective interposer 20 can be replaced with a new interposer 20 that is good (by polishing or heating to separate the defective interposer 20 from the semiconductor elements 21) and the semiconductor elements 21 can be disposed on the good interposer 20, because the packaging process is not yet performed, until the semiconductor structure passing the test process. Therefore, in a method of testing a semiconductor structure according to the present invention it is not necessary to dispose the good semiconductor elements 21, together with the detective interposer 20, as junk. Since the semiconductor structure 2 is not packaged yet, it is not necessary to dispose the package substrate, together with the defective interposer 20, as junk. As a result, the fabrication cost of the overall package is reduced.

Figure 1A:
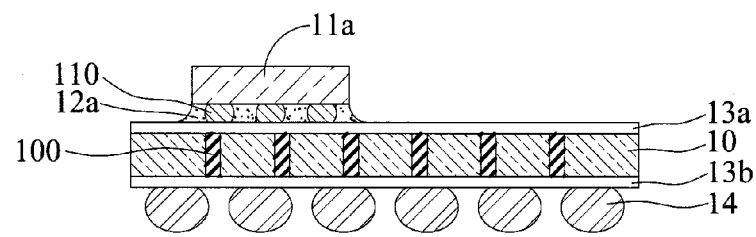
FIGS. 1A-1C are cross-sectional views illustrating a method of fabricating a semiconductor package according to the prior art.
Figure 1B:
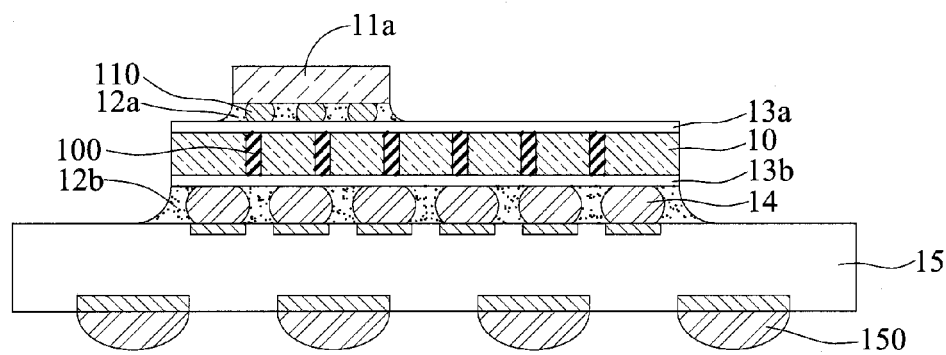
Figure 1C:
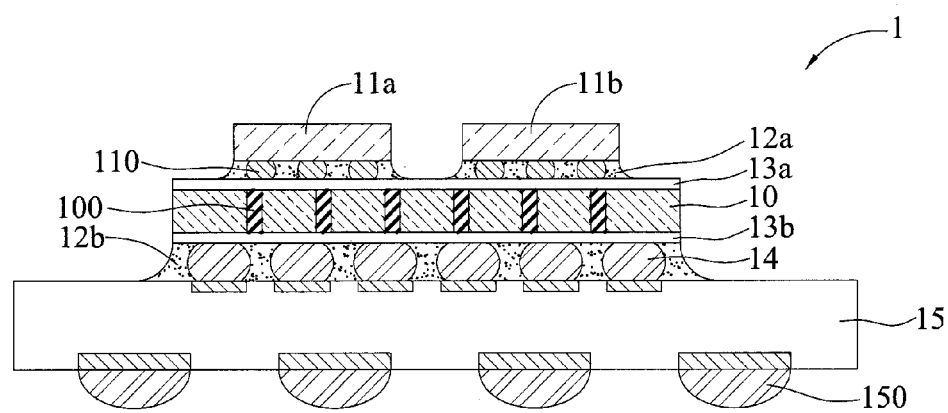
Figure 2E:
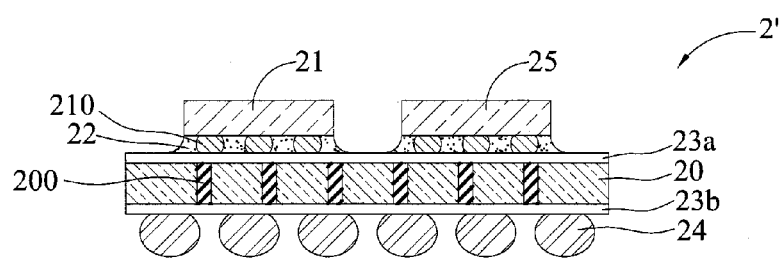

As shown in FIG. 2E, after the first test process, the carrier 3 and the supporting portion 33 are removed, and another semiconductor element 25 is further disposed on the redistribution layer 23a of the interposer 20 in a flip-chip manner. The another semiconductor element 25 and the semiconductor elements 21 are side by side disposed. A second test process is performed on the semiconductor structure 2' to test the another semiconductor element 25. After the second test process, the packaging process (not shown) is performed on the semiconductor structure 2' having semiconductor elements side by side disposed, to form a structure shown in FIG. 1C.

Since the electrical yield of the disposition of the semiconductor elements on the interposer 20 has been tested during the first test process, another good semiconductor element 25 can be avoided to be disposed on the defective interposer 20 found during the first test process. If the another semiconductor element 25 is found to be disposed on the defective interposer 20 during the second test process, the semiconductor elements 21 and 25 can still be re-processed and retained for further uses, thus solving the problem of the prior art that the good semiconductor element will be disposed, together with the defective interposer, as junk.

In a method of testing a semiconductor structure, the electrical performance of the interposer and the semiconductor elements is tested before the package process is performed, to speed up the test process, reduce the operation time, and increase the throughput.

If good semiconductor elements are disposed on a defective interposer, the defective interposer can be replaced with a new, good interposer and the good semiconductor elements can be disposed on the good interposer, because the packaging process is not yet performed. Therefore, it is not necessary to dispose the good semiconductor element, together with the defective interposer, as junk, and the fabrication cost is thus reduced.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A method of fabricating a semiconductor package, comprising:
providing at least a semiconductor structure having an interposer and a first semiconductor element disposed on the interposer;
disposing the semiconductor structure on a carrier having an insulation layer and a supporting portion, with the interposer being supported by the supporting portion, wherein the supporting portion and the first semiconductor element are disposed on and in direct contact with the insulation layer;
carrying out a first test process to test an electrical performance between the interposer and the first semiconductor element so as to determine if the interposer is defective, and if the interposer is defective, separating the interposer from the first semiconductor element and disposing the first semiconductor element on a new interposer that is determined to be good by the first test process;
removing the insulation layer and the supporting portion when the interposer and the first semiconductor element are determined to be good by the first test process;
disposing at least a second semiconductor element on the interposer side-by-side with the first semiconductor element;
carrying out a second test process to test an electrical performance between the interposer and the second semiconductor element so as to determine if the interposer is defective, and if the interposer is defective, separating the interposer from the first semiconductor element and the second semiconductor element, and disposing the first semiconductor element and the second semiconductor element on another new interposer that is determined to be good by the second test process; and
disposing the interposer with the first semiconductor element and the second semiconductor element on a package substrate when the interposer, the first semiconductor element, and the second semiconductor element are determined to be good by the second test process.

2. The method of claim 1, wherein the insulation layer is made of a polymer material having high thermal resistance.

3. The method of claim 1, wherein the supporting portion is made of a soft material.

4. The method of claim 3, wherein the soft material is resin or rubber.

5. The method of claim 1, wherein the supporting portion is made of a flexible material.

6. The method of claim 1, wherein the supporting portion is a sponge.

7. The method of claim 1, wherein the interposer has a plurality of conductive through vias communicating surfaces thereof.

8. The method of claim 7, wherein the interposer has a redistribution layer formed thereon and electrically connected to the conductive through vias, and the first semiconductor element is combined with and electrically connected to the redistribution layer.

9. The method of claim 7, wherein the interposer is a silicon-containing substrate.

10. The method of claim 1, further comprising forming a positioning portion on the carrier for placing the semiconductor structure on the carrier.

11. The method of claim 10, wherein the positioning portion is a laser notch.

\* \* \* \* \*